(12) United States Patent
Kikuchi et al.

(10) Patent No.: US 10,320,362 B2
(45) Date of Patent: Jun. 11, 2019

(54) ELASTIC WAVE DEVICE

(71) Applicant: Murata Manufacturing Co., Ltd., Nagaokakyo-shi, Kyoto-fu (JP)

(72) Inventors: Taku Kikuchi, Nagaokakyo (JP); Shin Saijo, Nagaokakyo (JP); Hisashi Yamazaki, Nagaokakyo (JP); Masahiro Fukushima, Nagaokakyo (JP); Yuji Miwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 381 days.

(21) Appl. No.: 15/171,181

(22) Filed: Jun. 2, 2016

(65) Prior Publication Data

US 2016/0277003 A1 Sep. 22, 2016

Related U.S. Application Data

(63) Continuation of application No. PCT/JP2014/083513, filed on Dec. 18, 2014.

(30) Foreign Application Priority Data

Dec. 27, 2013 (JP) .................................. 2013-272566
Sep. 19, 2014 (JP) .................................. 2014-191050

(51) Int. Cl.
*H03H 9/05* (2006.01)
*H03H 3/08* (2006.01)
(Continued)

(52) U.S. Cl.
CPC ......... *H03H 9/058* (2013.01); *H01L 41/0475* (2013.01); *H03H 3/08* (2013.01);
(Continued)

(58) Field of Classification Search
CPC ...... H03H 9/058; H03H 9/0585; H03H 9/059; H01L 41/0475
See application file for complete search history.

(56) References Cited

U.S. PATENT DOCUMENTS 5,030,930 A 7/1991 Sugai
2006/0138902 A1* 6/2006 Kando .................... H03H 3/08
310/313 D
(Continued)

FOREIGN PATENT DOCUMENTS

JP 2-26118 A 1/1990
JP 8-130434 A 5/1996
(Continued)

OTHER PUBLICATIONS

Official Communication issued in Japanese Patent Application No. 2015-554794, dated Jun. 20, 2017.
(Continued)

*Primary Examiner* — Bryan P Gordon
(74) *Attorney, Agent, or Firm* — Keating & Bennett, LLP

(57) ABSTRACT

An elastic wave device includes a multilayer film provided on a support substrate and including a piezoelectric thin film and a layer other than the piezoelectric thin film, an interdigital transducer electrode provided on one surface of the piezoelectric thin film, and an external connection terminal electrically connected to the interdigital transducer electrode. In a plan view, the multilayer film is partially absent or omitted in a region outside a region where the interdigital transducer electrode is provided, and the elastic wave device further includes a first insulating layer provided on the support substrate in at least a portion of a region where the multilayer film is absent or omitted.

23 Claims, 10 Drawing Sheets

(51) Int. Cl.
  *H03H 9/10* (2006.01)
  *H01L 41/047* (2006.01)
  *H03H 9/145* (2006.01)

(52) U.S. Cl.
  CPC ...... *H03H 9/1071* (2013.01); *H03H 9/14541* (2013.01); *H01L 2224/24* (2013.01)

(56) References Cited

U.S. PATENT DOCUMENTS

| | | | | |
|---|---|---|---|---|
| 2007/0252481 | A1* | 11/2007 | Iwamoto | H03H 9/0576 310/344 |
| 2009/0096321 | A1* | 4/2009 | Aikawa | H03H 3/08 310/313 R |
| 2010/0038992 | A1* | 2/2010 | Moriya | H03H 9/02574 310/313 B |
| 2010/0225202 | A1* | 9/2010 | Fukano | H03H 9/059 310/313 C |
| 2011/0023592 | A1* | 2/2011 | Hortig | B60C 23/0411 73/146.5 |
| 2012/0194033 | A1* | 8/2012 | Tsuda | H03H 3/08 310/313 C |
| 2012/0299665 | A1 | 11/2012 | Yokoyama et al. | |
| 2013/0285768 | A1* | 10/2013 | Watanabe | H03H 9/0222 333/193 |
| 2013/0307372 | A1* | 11/2013 | Ito | H03H 3/08 310/311 |
| 2014/0130319 | A1* | 5/2014 | Iwamoto | H03H 3/02 29/25.35 |
| 2014/0191619 | A1 | 7/2014 | Ito et al. | |

FOREIGN PATENT DOCUMENTS

| | | |
|---|---|---|
| JP | 2002-232259 A | 8/2002 |
| JP | 2005-210475 A | 8/2005 |
| JP | 2006-69837 A | 3/2006 |
| JP | 2006-121356 A | 5/2006 |
| JP | 2006-303763 A | 11/2006 |
| JP | 2007-228328 A | 9/2007 |
| JP | 2008-060382 A | 3/2008 |
| JP | 2009-188844 A | 8/2009 |
| JP | 2011-171852 A | 9/2011 |
| JP | 2013-065940 A | 4/2013 |
| JP | 2013-214843 A | 10/2013 |
| WO | 2009/057699 A1 | 5/2009 |
| WO | 2012/086639 A1 | 6/2012 |
| WO | 2012/128268 A1 | 9/2012 |

OTHER PUBLICATIONS

Official Communication issued in International Application PCT/JP2014/083513, dated Mar. 3, 2015.
Official Communication issued in Chinese Patent Application No. 2014800662630, dated Nov. 27, 2017.

* cited by examiner

ELASTIC WAVE DEVICE

BACKGROUND OF THE INVENTION

1. Field of the Invention

The present invention relates to an elastic wave device including a piezoelectric thin film, and particularly relates to an elastic wave device in which a multilayer film including a piezoelectric thin film and another layer is laminated on a support substrate.

2. Description of the Related Art

A surface acoustic wave device has been widely used as a resonator or a band-pass filter. International Publication No. 2012/086639 discloses an elastic wave device in which a high-acoustic-velocity film, a low-acoustic-velocity film, and a multilayer film including a piezoelectric thin film formed of $LiTaO_3$ are laminated on a support substrate in this order. The low-acoustic-velocity film is a film through which a bulk wave propagates at an acoustic velocity lower than that of a bulk wave that propagates through the piezoelectric thin film, and the high-acoustic-velocity film is a film through which a bulk wave propagates at an acoustic velocity higher than that of an elastic wave that propagates through the piezoelectric thin film. International Publication No. 2012/086639 indicates that glass, silicon, and the like may be used as the material of the support substrate.

In the elastic wave device described in International Publication No. 2012/086639, the piezoelectric thin film is formed of a piezoelectric single crystal such as $LiTaO_3$, and thus, fracturing or cracking of the piezoelectric thin film is likely to occur by an external force.

Therefore, in a step of joining an external connection terminal such as a bump in the elastic wave device described in International Publication No. 2012/086639, when a force is applied to the multilayer film, the piezoelectric thin film may fracture or crack.

Meanwhile, the elastic wave device is obtained by dividing a mother structure through cutting with a dicing machine. Also due to a force applied during cutting with the dicing machine, the piezoelectric thin film may fracture or crack.

Furthermore, during connection of the external connection terminal or cutting with the dicing machine, interfacial peeling may occur in the multilayer film including the piezoelectric thin film, so that characteristics may deteriorate.

SUMMARY OF THE INVENTION

Preferred embodiments of the present invention provide an elastic wave device in which fracturing or cracking of a piezoelectric thin film is less likely to occur and characteristics are less likely to deteriorate.

An elastic wave device according to a preferred embodiment of the present invention includes a support substrate; a multilayer film provided on the support substrate and including a piezoelectric thin film and a layer other than the piezoelectric thin film; an interdigital transducer electrode provided on one surface of the piezoelectric thin film; and an external connection terminal electrically connected to the interdigital transducer electrode. In a plan view, the multilayer film is partially removed in a region outside a region where the interdigital transducer electrode is provided, and the elastic wave device further includes a first insulating layer provided on the support substrate in at least a portion of a region where the multilayer film is removed.

In a specific aspect of an elastic wave device according to a preferred embodiment of the present invention, the first insulating layer is made of a resin.

In another aspect of an elastic wave device according to a preferred embodiment of the present invention, the support substrate is a conductor or a semiconductor, and the first insulating layer is located below the external connection terminal.

Preferably, the first insulating layer is a resin.

In still another aspect of an elastic wave device according to a preferred embodiment of the present invention, the elastic wave device includes a wiring electrode connected to the interdigital transducer electrode; an electrode pad connected to the interdigital transducer electrode via the wiring electrode; and the external connection terminal joined on the electrode pad.

In still another aspect of an elastic wave device according to a preferred embodiment of the present invention, the first insulating layer is located below the electrode pad.

In another aspect of an elastic wave device according to a preferred embodiment of the present invention, the first insulating layer includes an insulating layer extension portion extending from the region where the multilayer film is removed, to a region where the multilayer film is provided.

In still another aspect of an elastic wave device according to a preferred embodiment of the present invention, the insulating layer extension portion covers a part of the piezoelectric thin film.

In still another aspect of an elastic wave device according to a preferred embodiment of the present invention, the wiring electrode extends from the upper surface of the multilayer film via a side surface of the multilayer film to the electrode pad.

In still another aspect of an elastic wave device according to a preferred embodiment of the present invention, the side surface on which the wiring electrode of the multilayer film is provided is an inclined surface that is inclined from a direction perpendicular or substantially perpendicular to an upper surface of the support substrate, and the inclined surface is closer to the interdigital transducer electrode side as the inclined surface extends from below toward above.

In still another aspect of an elastic wave device according to a preferred embodiment of the present invention, the inclined surface of the multilayer film is provided with a step.

In still another aspect of an elastic wave device according to a preferred embodiment of the present invention, the first insulating layer covers at least a portion of the inclined surface.

In another aspect of an elastic wave device according to a preferred embodiment of the present invention, a plurality of interdigital transducer electrodes are provided as the interdigital transducer electrode provided on the one surface of the piezoelectric thin film, and the elastic wave device further includes a connection wire connecting the adjacent interdigital transducer electrodes to each other.

In another aspect of an elastic wave device according to a preferred embodiment of the present invention, a portion of the layers of the multilayer film is provided between the connection wire and the support substrate.

In another aspect of an elastic wave device according to a preferred embodiment of the present invention, a second insulating layer is provided between the support substrate and the connection wire and is made of the same material as that of the first insulating layer.

In still another aspect of an elastic wave device according to a preferred embodiment of the present invention, a third insulating layer is further provided between the multilayer film and the support substrate.

In another aspect of an elastic wave device according to a preferred embodiment of the present invention, the first insulating layer is provided on the third insulating layer and provided between a side surface of the multilayer film and the electrode pad.

In another aspect of an elastic wave device according to a preferred embodiment of the present invention, the first insulating layer extends from a height position located below the electrode pad via the side surface of the multilayer film to an upper surface of the multilayer film, and an outer surface of the first insulating layer on the side surface of the multilayer film is an inclined surface that is inclined from a direction perpendicular or substantially perpendicular to an upper surface of the support substrate and is closer to the interdigital transducer electrode side as the inclined surface extends from below toward above.

In another aspect of an elastic wave device according to a preferred embodiment of the present invention, the multilayer film includes, as other layers, a high-acoustic-velocity film through which a bulk wave propagates at an acoustic velocity higher than that of an elastic wave that propagates through the piezoelectric thin film, and a low-acoustic-velocity film laminated on the high-acoustic-velocity film and through which a bulk wave propagates at an acoustic velocity lower than that of a bulk wave that propagates through the piezoelectric thin film, and the piezoelectric thin film is laminated on the low-acoustic-velocity film.

In another aspect of an elastic wave device according to a preferred embodiment of the present invention, a low-acoustic-velocity film provided on a lower surface of the piezoelectric thin film and through which a transversal wave propagates at a relatively low acoustic velocity, is included, and the support substrate is a high-acoustic-velocity support substrate laminated on a lower surface of the low-acoustic-velocity film and through which a transversal wave propagates at a relatively high acoustic velocity.

In still another aspect of an elastic wave device according to a preferred embodiment of the present invention, the external connection terminal includes a metal bump.

In still another aspect of an elastic wave device according to a preferred embodiment of the present invention, the elastic wave device further includes a frame-shaped support member that surrounds the region where the interdigital transducer electrode is provided; and a lid member fixed on the support member so as to close an opening in the frame-shaped support member.

In still another aspect of an elastic wave device according to a preferred embodiment of the present invention, the external connection terminal includes an under bump metal layer and a metal bump joined to the under bump metal layer.

According to elastic wave devices according to various preferred embodiments of the present invention, fracturing or cracking of the piezoelectric thin film due to a force applied during cutting with a dicing machine or when the external connection terminal is joined is less likely to occur. In addition, interfacial peeling at the multilayer film is also less likely to occur, and deterioration of characteristics is also less likely to occur. Therefore, it is possible to provide an elastic wave device having excellent reliability and less characteristics variations.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the accompanying drawings to clarify the present invention.

It is noted that each preferred embodiment described in the present specification is illustrative, and configurations may be partially substituted or combined between different preferred embodiments.

Figure 2:
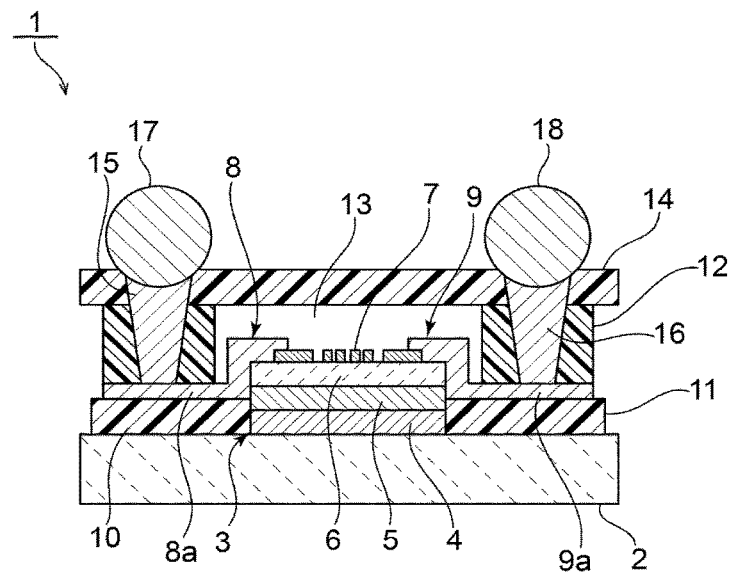
FIG. 2 is an elevational cross-sectional view of the elastic wave device according to the first preferred embodiment of the present invention.
Figure 3:
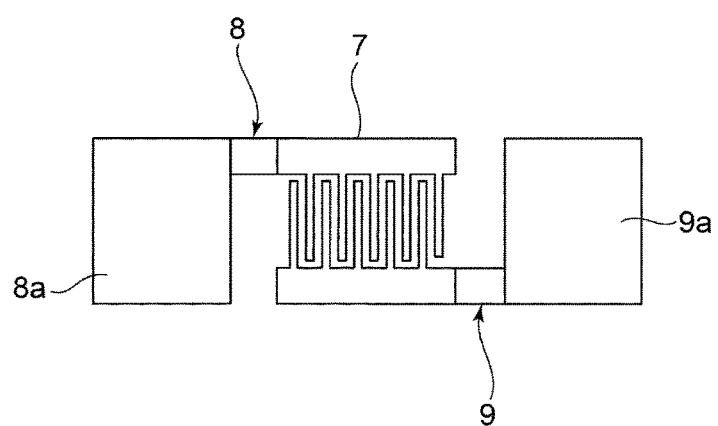
FIG. 3 is a schematic plan view showing a structure on a support substrate of the elastic wave device according to the first preferred embodiment.

FIG. 2 is an elevational cross-sectional view of an elastic wave device according to a first preferred embodiment of the present invention, and FIG. 3 is a schematic plan view showing a structure on a support substrate of the elastic wave device.

The elastic wave device 1 includes a support substrate 2. A multilayer film 3 is laminated on the support substrate 2. The multilayer film 3 preferably is formed by laminating a high-acoustic-velocity film 4, a low-acoustic-velocity film 5, and a piezoelectric thin film 6 in order from below. The high-acoustic-velocity film 4 includes a film through which a bulk wave propagates at an acoustic velocity higher than that of an elastic wave that propagates through the piezoelectric thin film 6. In addition, the low-acoustic-velocity film 5 is a film through which a bulk wave propagates at an acoustic velocity lower than that of a bulk wave that propagates through the piezoelectric thin film 6. In the present preferred embodiment, the piezoelectric thin film 6 preferably is made of a piezoelectric single crystal such as $LiTaO_3$ or $LiNbO_3$.

The piezoelectric thin film 6 is a thin film made of the piezoelectric single crystal described above. The thickness of the piezoelectric thin film 6 preferably is equal to or less than about $1.5\lambda$ when the wavelength of an elastic wave that is determined by the period of an interdigital transducer electrode is denoted by $\lambda$. Therefore, fracturing or cracking of the piezoelectric thin film 6 is likely to occur by an external force or the like. However, in the present preferred embodiment, it is possible to effectively prevent fracturing or cracking of the piezoelectric thin film 6 as described later.

According to the present preferred embodiment, it is possible to trap an elastic wave in a portion where the piezoelectric thin film 6 and the low-acoustic-velocity film 5 are laminated, by the high-acoustic-velocity film 4. Therefore, the elastic wave is prevented from leaking to a structure below the high-acoustic-velocity film 4.

The high-acoustic-velocity film 4 may be made of an appropriate material as long as the high-acoustic-velocity film 4 is able to trap the above elastic wave. Examples of such a material include aluminum nitride, aluminum oxide, silicon carbide, silicon nitride, silicon oxynitride, DLC, and diamond. In addition, a mixed material containing these materials as principal components may be used.

The low-acoustic-velocity film 5 also may be made of an appropriate material in which the above bulk wave acoustic velocity is low. Examples of such a material include silicon oxide, glass, silicon oxynitride, tantalum oxide, and compounds obtained by adding fluorine, carbon, boron, or the like to silicon oxide. In addition, the low-acoustic-velocity film 5 also may be made of a mixed material containing these materials as principal components.

The configuration in which the high-acoustic-velocity film 4 and the low-acoustic-velocity film 5 are disposed between the piezoelectric thin film 6 and the support substrate 2 allows a Q value to be increased as disclosed in International Publication No. 2012/086639 described above.

In the present preferred embodiment, the multilayer film 3 includes the piezoelectric thin film 6 and the high-acoustic-velocity film 4 and the low-acoustic-velocity film 5 as other layers. In various preferred embodiments of the present invention, the structure of the multilayer film 3 is not limited thereto. Therefore, one or two layers other than a piezoelectric thin film are not limited to the high-acoustic-velocity film 4 and the low-acoustic-velocity film 5, and may be films having another function, such as an adhesiveness improving film and a temperature compensation film. In addition, an appropriate dielectric, insulator, or the like may be used as the material defining the other layers.

Figure 7:
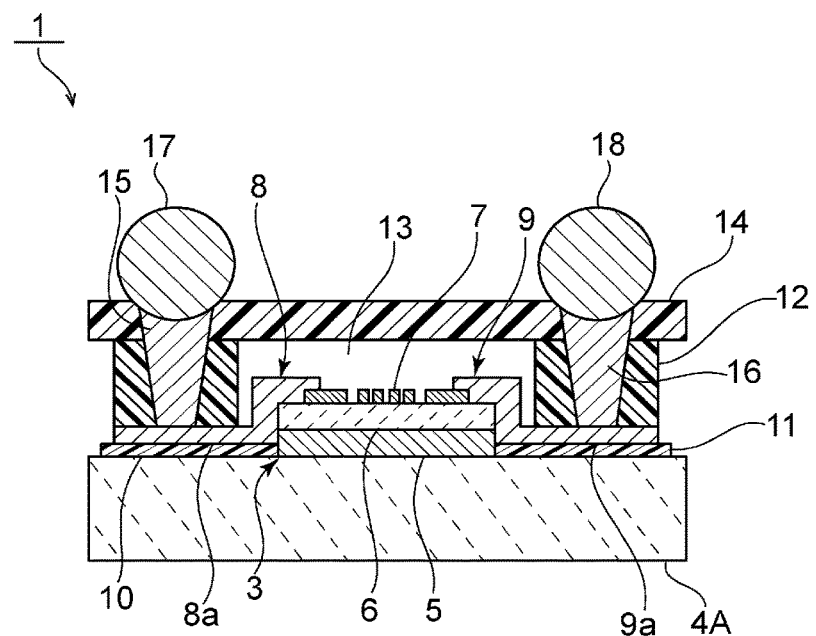
FIG. 7 is an elevational cross-sectional view of an elastic wave device according to a modification of the first preferred embodiment of the present invention.

Instead of the high-acoustic-velocity film 4, a high-acoustic-velocity support substrate 4A may be used as in a modification shown in FIG. 7, to trap an elastic wave in the portion where the piezoelectric thin film 6 and the low-acoustic-velocity film 5 are laminated. That is, even with a structure in which the low-acoustic-velocity film 5 and the piezoelectric thin film 6 are laminated on the high-acoustic-velocity support substrate 4A, the same advantageous effects are obtained. Here, glass, silicon, alumina, a piezoelectric single crystal, such as $LiTaO_3$ or $LiNbO_3$, or the like is used as the material of the high-acoustic-velocity support substrate.

The support substrate 2 preferably is made of silicon in the present preferred embodiment, and is a semiconductor substrate. However, the support substrate 2 is not limited to a semiconductor such as silicon, and may be a conductor. In addition, the support substrate 2 may be made of an insulating material such as glass or a synthetic resin.

An interdigital transducer electrode 7 is provided on the piezoelectric thin film 6. Wiring electrodes 8 and 9 are electrically connected to the interdigital transducer electrode 7. Electrode pads 8a and 9a are connected to the wiring electrodes 8 and 9.

The wiring electrodes 8 and 9 extend from positions on the piezoelectric thin film 6 to the outer side of a region where the piezoelectric thin film 6 is provided. In the present preferred embodiment, first insulating layers 10 and 11 are provided at the outer side of a region where the multilayer film 3 including the piezoelectric thin film 6 is provided, that is, in a region outside a portion where the interdigital transducer electrode 7 is provided. In other words, in a plan view, the multilayer film 3 is partially removed in the region outside the region where the interdigital transducer electrode 7 is provided, and each of the first insulating layers 10 and 11 is provided in at least a portion of a region where the multilayer film 3 is removed. The multilayer film 3 may not be fully removed. That is, if the multilayer film 3 is partially or substantially removed, it is possible to obtain the advantageous effects of the present invention.

In the present preferred embodiment, the first insulating layers 10 and 11 are in contact with side surfaces of the multilayer film 3. However, the first insulating layers 10 and 11 may be spaced apart from the side surfaces of the multilayer film 3.

Preferably, as in the present preferred embodiment, the first insulating layers 10 and 11 are in contact with the side surfaces of the multilayer film 3. Accordingly, it is possible to more reliably prevent the wiring electrodes 8 and 9 from being in contact with the support substrate 2.

The material of the first insulating layers 10 and 11 is not particularly limited as long as the material is an insulating material. However, preferably, resin materials such as polyimide resin, epoxy resin, acrylic resin, silicone resin, and SOG are used, since the resin materials have a high effect of alleviating stress applied when the above-described external connection terminal is joined.

The first insulating layers 10 and 11 may be made of an insulating ceramic material such as alumina.

The wiring electrodes 8 and 9 extend from the positions on the piezoelectric thin film 6 via the side surfaces of the multilayer film 3 onto the first insulating layers 10 and 11. The electrode pads 8a and 9a are provided at portions where the wiring electrodes 8 and 9 extend onto the first insulating layers 10 and 11, so as to be integrated with the wiring electrodes 8 and 9.

The interdigital transducer electrode 7, the wiring electrodes 8 and 9, and the electrode pads 8a and 9a may be formed by using an appropriate metal such as Al, Cu, Ag, Pt, W, Au, Ag—Pd, Al—Cu, Ti, Ni, and NiCr, or an alloy containing these metals. Alternatively, these electrodes may be made of a laminated metal film including a plurality of laminated films.

The wiring electrodes 8 and 9 and the electrode pads 8a and 9a extend onto the first insulating layers 10 and 11, and are not in contact with the support substrate 2. Therefore, even when the support substrate 2 is made of a semiconductor or a conductor, electrical continuity is not established between the wiring electrodes 8 and 9.

When the support substrate 2 is made of an insulating material, portions of the wiring electrodes 8 and 9 may be in contact with the support substrate 2.

A frame-shaped support member 12 is provided on the electrode pads 8a and 9a. The support member 12 is made of an appropriate synthetic resin such as polyimide resin. The support member 12 preferably has a rectangular or substantially rectangular frame-shaped planar shape. The rectangular or substantially rectangular frame-shaped support member 12 is disposed so as to surround the portion where the interdigital transducer electrode 7 is provided, that is, the portion where the multilayer film 3 is provided. Accordingly, a space 13 that a surface acoustic wave excitation portion having the interdigital transducer electrode 7 faces is provided. A lid member 14 is fixed to the support member 12 so as to close the upper opening of the space 13. The lid member 14 may be made of an appropriate synthetic resin such as epoxy resin. However, the lid member 14 may be made of another insulating material such as an insulating ceramic material.

Through holes extend through the support member 12 and the lid member 14. Under bump metal layers 15 and 16 are provided within the through holes. The under bump metal layers 15 and 16 are made of an appropriate metal such as Au, Ag, Cu, Ni, Pd, Sn, and Al or an alloy thereof. Ends of the under bump metal layers 15 and 16 are joined to the electrode pads 8a and 9a. In addition, metal bumps 17 and 18 are joined on the under bump metal layers 15 and 16. The metal bumps 17 and 18 project upward from the lid member 14. Therefore, it is possible to surface-mount the elastic wave device 1 on a circuit board from the side at which the metal bumps 17 and 18 are provided.

In the present preferred embodiment, the under bump metal layers 15 and 16 and the metal bumps 17 and 18 define the external connection terminal.

Meanwhile, in the elastic wave device 1 according to the present preferred embodiment, the first insulating layers 10 and 11 are located below the electrode pads 8a and 9a. Therefore, even if a force is applied to the electrode pads 8a and 9a side when the under bump metal layers 15 and 16 and the metal bumps 17 and 18 are joined to each other, it is possible to alleviate this force. In addition, the multilayer film 3 is not present below a portion where the external connection terminal is joined. Therefore, the piezoelectric thin film 6 is not present below a portion where the metal bumps 17 and 18 as the external connection terminal are joined. Accordingly, in a step of forming the external connection terminal such as the metal bumps 17 and 18, fractures or cracks in the piezoelectric thin film 6 is less likely to occur. In addition, interfacial peeling at the multilayer film 3 is less likely to occur.

Figure 1:
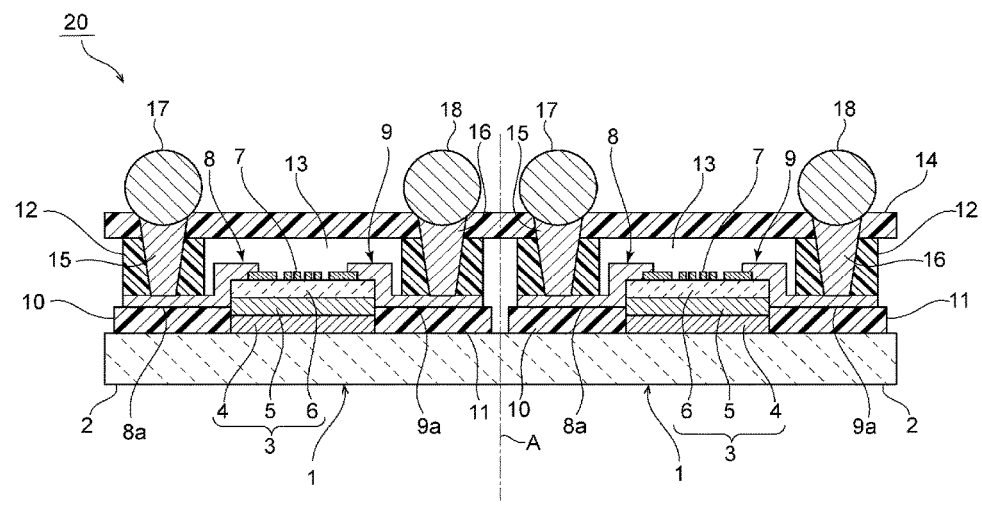
FIG. 1 is an elevational cross-sectional view illustrating a process for obtaining an elastic wave device according to a first preferred embodiment of the present invention.

On the other hand, during manufacture of the elastic wave device 1, normally, a mother structure is produced and is cut with a dicing machine to obtain the elastic wave device 1. More specifically, as shown in FIG. 1, a mother structure 20 is obtained in which a plurality of elastic wave devices 1 are integrated with each other. The mother structure 20 is cut along a dicing line A shown by an alternate long and short dash line. Cutting with the dicing machine is performed using a dicing blade. In the present preferred embodiment, the multilayer film 3 is not present at a portion that is cut with the dicing machine. Therefore, during cutting with the dicing machine as well, the interfacial peeling at the multilayer film 3 does not occur, and the piezoelectric thin film 6 does not fracture or crack.

Accordingly, according to the present preferred embodiment, it is possible to effectively prevent fracturing or cracking of the piezoelectric thin film, and it is possible to prevent deterioration of the characteristics of the elastic wave device 1.

Figure 4:
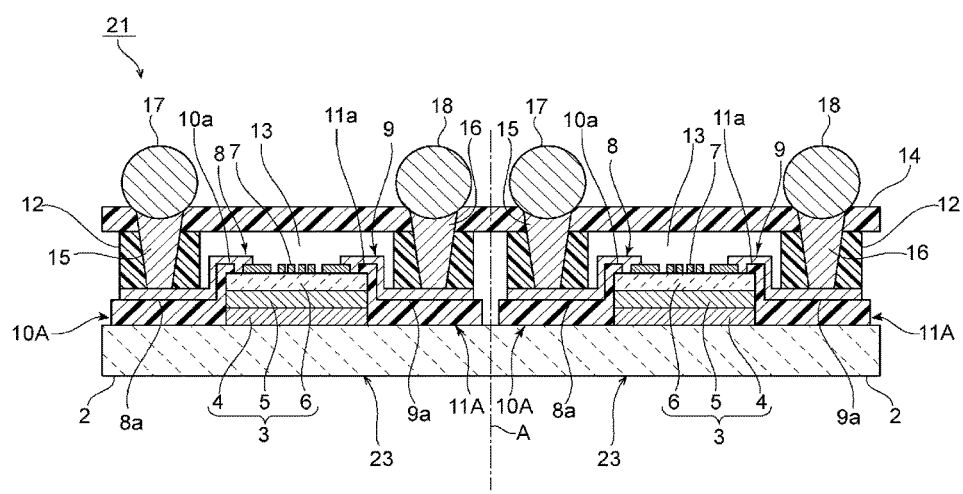
FIG. 4 is an elevational cross-sectional view illustrating a process for obtaining an elastic wave device according to a second preferred embodiment of the present invention.

FIG. 4 is an elevational cross-sectional view for explaining a process for manufacturing an elastic wave device according to a second preferred embodiment of the present invention. By dividing a mother structure 21 shown in FIG. 4 along a dicing line A, it is possible to obtain elastic wave devices 23. The elastic wave device 23 according to the second preferred embodiment is different from the elastic wave device 1 according to the first preferred embodiment in positions where first insulating layers 10A and 11A are formed. The first insulating layers 10A and 11A include insulating layer extension portions 10a and 11a extending to a region where the multilayer film 3 is provided. Each of the insulating layer extension portions 10a and 11a covers a part of the piezoelectric thin film 6. On the upper surface of the piezoelectric thin film 6, the first insulating layers 10A and 11A extend to the outer side of the region where the interdigital transducer electrode 7 is provided, that is, to a portion outside the excitation portion.

The elastic wave device 23 according to the second preferred embodiment is the same as the elastic wave device 1 according to the first preferred embodiment in the other points, and thus the description of the other points is omitted by incorporating the description of the first preferred embodiment in the second preferred embodiment by reference.

In the second preferred embodiment as well, since the first insulating layers 10A and 11A are provided, it is possible to prevent fracturing or cracking of the piezoelectric thin film 6, and it is possible to prevent interfacial peeling at the multilayer film 3, similarly as in the first preferred embodiment.

Figure 10:
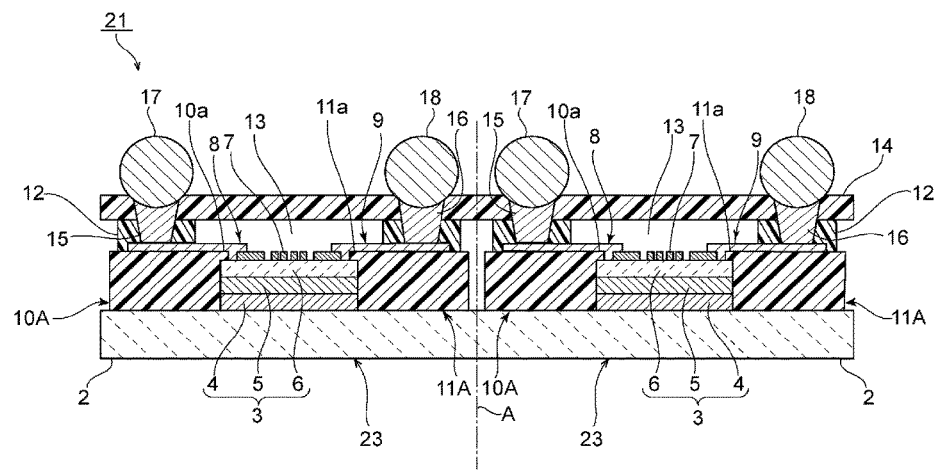
FIG. 10 is an elevational cross-sectional view illustrating a modification of the elastic wave device according to the second preferred embodiment of the present invention.

As in a modification of the second preferred embodiment shown in FIG. 10, the first insulating layers 10A and 11A may be made thick. In FIG. 10, the upper surfaces of the first insulating layers 10A and 11A are located above the upper surface of the piezoelectric thin film 6. The wiring electrodes 8 and 9 are provided on the upper surfaces of the first insulating layers 10A and 11A. The wiring electrodes 8 and 9 extend, at the inner ends thereof, via side surfaces of the first insulating layers 10A and 11A onto the lower piezoelectric thin film 6.

The present modification is also the same as the elastic wave device 23 according to the second preferred embodiment in the other points. Thus, it is possible to prevent fracturing or cracking of the piezoelectric thin film 6. In addition, it is possible to prevent interfacial peeling at the multilayer film 3.

The first and second preferred embodiments have a wafer level package (WLP) structure including the above support member 12 and lid member 14.

Figure 5:
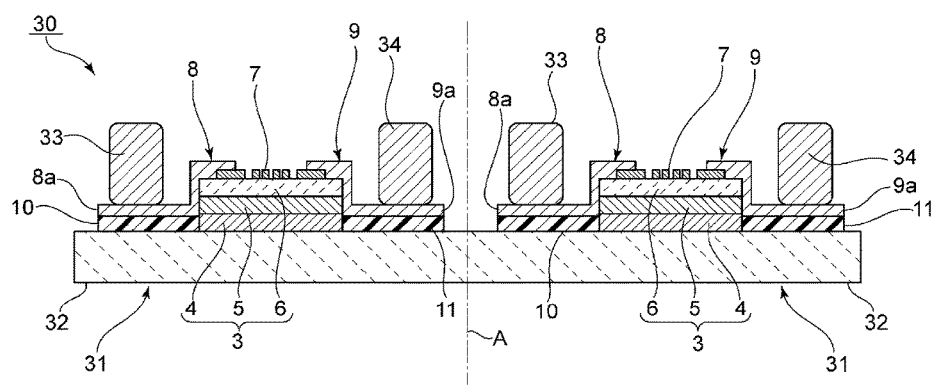
FIG. 5 is an elevational cross-sectional view illustrating a process for obtaining an elastic wave device according to a third preferred embodiment of the present invention.

FIG. 5 is an elevational cross-sectional view showing a process for obtaining an elastic wave device according to a third preferred embodiment of the present invention. In the third preferred embodiment, an elastic wave device 31 having a chip size package (CSP) structure, not the above WLP structure, is provided. FIG. 5 shows a mother structure 30. By cutting the mother structure 30 along a dicing line A, elastic wave devices 31 are obtained.

The elastic wave device 31 is the same as the first preferred embodiment except for the package structure. That is, the multilayer film 3 is laminated on a support substrate 32. The interdigital transducer electrode 7 is provided on the piezoelectric thin film 6 of the multilayer film 3. The wiring electrodes 8 and 9 are electrically connected to the interdigital transducer electrode 7. In addition, the first insulating layers 10 and 11 are provided on the support substrate 32. The wiring electrodes 8 and 9 are connected to the electrode pads 8a and 9a. The structure so far is the same as that in the first preferred embodiment. Therefore, the detailed description of each component is omitted by incorporating the description of the first preferred embodiment by reference.

In the present preferred embodiment, metal bumps 33 and 34 are joined as an external connection terminal directly on the electrode pads 8a and 9a. In the present preferred embodiment, the metal bumps 33 and 34 are stud bumps made of Au. Surface-mounting on another circuit board is enabled by using the metal bumps 33 and 34.

In the present preferred embodiment as well, first insulating layers 10 and 11 are provided in a region outside the multilayer film 3. Since the first insulating layers 10 and 11 are located below the electrode pads 8a and 9a, no force is applied to the multilayer film 3 including the piezoelectric thin film 6 when the metal bumps 33 and 34 are joined as the external connection terminal. Thus, interfacial peeling at the multilayer film 3 and fracture or crack of the piezoelectric thin film 6 are less likely to occur.

The first insulating layers 10 and 11 are preferably made of a resin. In this case, it is possible to alleviate stress applied when the metal bumps 33 and 34 are joined. However, the first insulating layers 10 and 11 may be made of another insulating material such as an insulating ceramic material.

In the present preferred embodiment as well, a dicing line A is spaced away from the multilayer film 3. Therefore, even when cutting is performed with a dicing machine, interfacial peeling at the multilayer film 3 and fracturing or cracking of the piezoelectric thin film 6 are less likely to occur.

In the first to third preferred embodiments, the first insulating layers 10, 11, 10A, and 11A do not reach the dicing line A, but may be provided to reach the dicing region. However, to prevent peeling or the like during dicing with the dicing machine, the first insulating layers 10, 11, 10A, and 11A are desirably provided so as not to reach a dicing line as in the above preferred embodiments.

Figure 8:
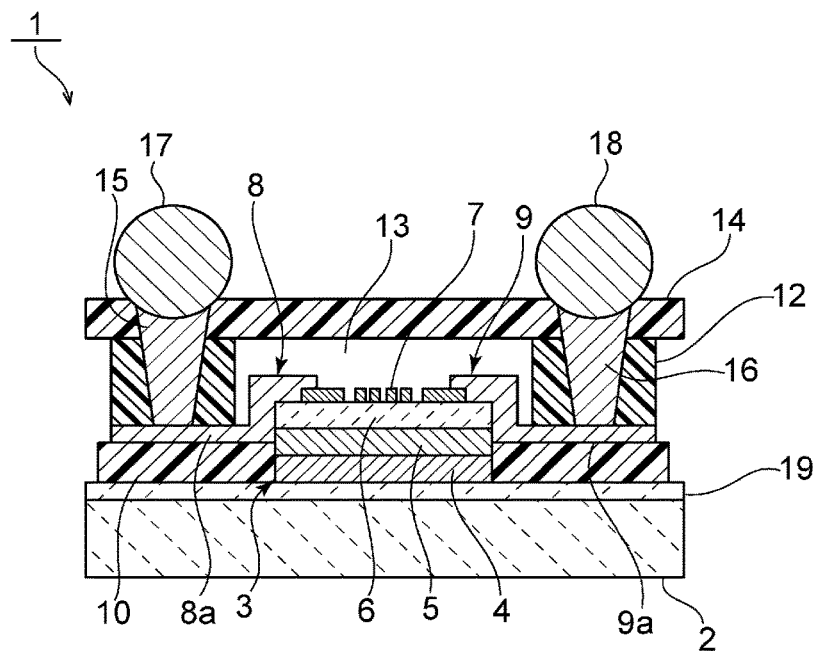
FIG. 8 is an elevational cross-sectional view of an elastic wave device according to another modification of the first preferred embodiment of the present invention.
Figure 9:
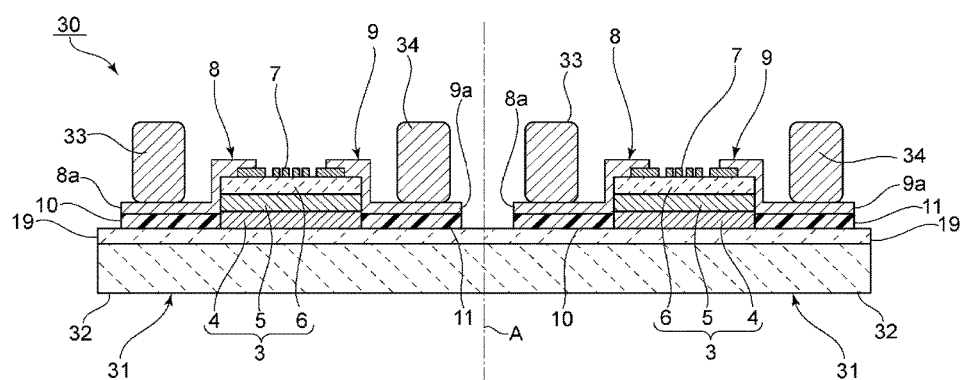
FIG. 9 is an elevational cross-sectional view illustrating a process for obtaining an elastic wave device according to a modification of the third preferred embodiment of the present invention.

In the present preferred embodiment, the one interdigital transducer electrode 7 is preferably provided, but the electrode structure of the elastic wave excitation portion including the interdigital transducer electrode on the piezoelectric thin film 6 may be configured as appropriate according to application. In addition, in the first and second preferred embodiments, the multilayer film structure has a laminate structure including a piezoelectric thin film, a low-acoustic-velocity film, and a high-acoustic-velocity film in order from above, but is not limited thereto. As in a modification shown in FIG. 8 or a modification shown in FIG. 9, a joining layer 19 made of a dielectric or the like may be provided between the high-acoustic-velocity film 4 and the support substrate 2.

Next, specific non-limiting experimental examples will be described.

The elastic wave device 1 was formed according to the first preferred embodiment of the present invention. However, the electrode structure including the interdigital transducer electrode 7 was designed to configure a band pass filter. As the piezoelectric thin film 6, a LiTaO$_3$ single crystal film having a thickness of 0.6 μm was used. By so doing, a band pass type filter having a pass band of 1850 MHz to 1950 MHz was created as an example. In the creation, a mother structure was prepared, and then divided along a dicing line to obtain an elastic wave device of the example.

Figure 6:
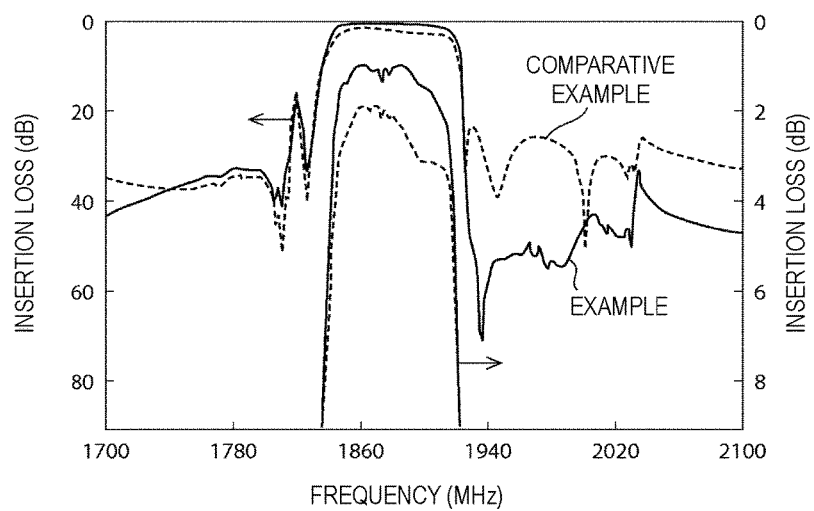
FIG. 6 is a diagram showing the attenuation frequency characteristics of elastic wave devices of an example and a comparative example.

For comparison, an elastic wave device was created in the same manner as in the above example, except that the first insulating layers 10 and 11 were not provided. FIG. 6 shows the attenuation frequency characteristics of the elastic wave devices of the example and the comparative example.

As is clear from FIG. 6, according to the example, it appears that the insertion loss in the pass band is very low and the attenuation outside the band is sufficiently large, as compared to the comparative example. This is thought to be because a current between the electrode pads 8a and 9a through the silicon substrate is more assuredly blocked by the first insulating layers 10 and 11 in the example.

Figure 11:
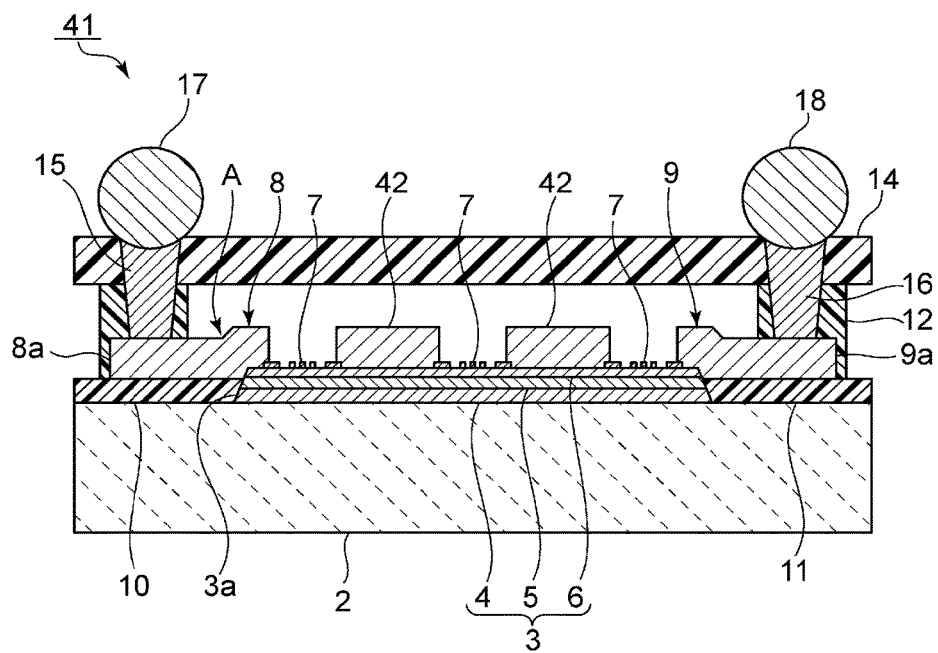
FIG. 11 is an elevational cross-sectional view of an elastic wave device according to a fourth preferred embodiment of the present invention.
Figure 12:
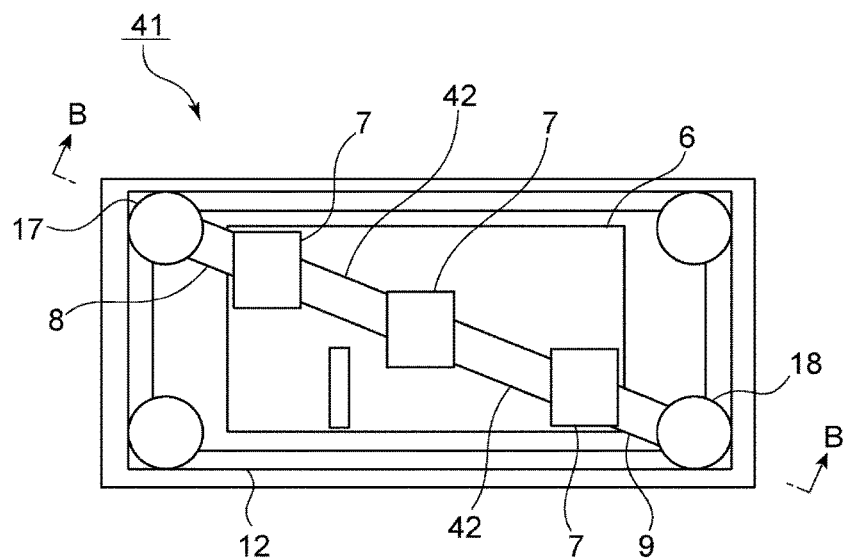
FIG. 12 is a schematic plan view illustrating the electrode structure of the elastic wave device according to the fourth preferred embodiment.

FIG. 11 is an elevational cross-sectional view of an elastic wave device according to a fourth preferred embodiment of the present invention. FIG. 12 is a schematic plan view for explaining the electrode structure of the elastic wave device according to the fourth preferred embodiment.

In the elastic wave device 41 according to the fourth preferred embodiment, a multilayer film 3 is laminated on a support substrate 2. The multilayer film 3 includes a high-acoustic-velocity film 4 as a high-acoustic-velocity material, a low-acoustic-velocity film 5, and a piezoelectric thin film 6 in order from below. The materials of the support substrate 2 and the multilayer film 3 are the same as in the first preferred embodiment described above.

The elastic wave device 41 is different from the elastic wave device 1 shown in FIG. 2, in that a plurality of interdigital transducer electrodes 7 are provided on the piezoelectric thin film 6 and side surfaces 3a of the multilayer film 3 are inclined surfaces inclined from a direction perpendicular or substantially perpendicular to the upper surface of the support substrate 2.

The wiring electrode 8 extends from the upper surface of the multilayer film 3, that is, the upper surface of the piezoelectric thin film 6, via a portion of the side surface 3a onto the first insulating layer 10. At the wiring electrode 9 side as well, the wiring electrode 9 extends from the upper surface of the piezoelectric thin film 6 via the side surface 3a onto the first insulating layer 11.

The first insulating layers 10 and 11 are in contact with the respective side surfaces 3a.

That is, each of the inner surfaces of the first insulating layers 10 and 11 is in contact with a portion of the side surface 3a. The upper surfaces of the first insulating layers 10 and 11 are located at the intermediate height position of the low-acoustic-velocity film 5 of the multilayer film 3.

The lower surfaces of the electrode pads 8a and 9a are in contact with the upper surfaces of the first insulating layers 10 and 11. Thus, since the heights of the lower surfaces of the electrode pads 8a and 9a are sufficiently high and the wiring electrode 8 is provided along the side surface 3a, it is possible to alleviate a change of a portion indicated by an arrow A in FIG. 11. Therefore, breaking of the wiring electrode 8 at the portion indicated by the arrow A is less likely to occur.

FIG. 12 schematically shows a region where the interdigital transducer electrodes are provided, in a rectangular or substantially rectangular frame. FIG. 11 is a view corresponding to a cross-section along the line B-B in FIG. 12.

The adjacent interdigital transducer electrodes 7 are electrically connected to each other via a connection wire 42. The connection wire 42 is made of the same metallic material as that of the wiring electrodes 8 and 9. However, the connection wire 42 may be made of another metal.

In various preferred embodiments of the present invention, as in the elastic wave device 41, a plurality of interdigital transducer electrodes 7 may be provided on the piezoelectric thin film 6, thus defining a filter circuit. That is, the number of the interdigital transducer electrodes 7 provided on the piezoelectric thin film 6 may be two or more.

The connection wire 42 is provided on the piezoelectric thin film 6. The other components of the elastic wave device 41 are substantially the same as those of the elastic wave device 1 shown in FIG. 2, thus the same portions are designated by the same reference numerals, and the description thereof is omitted.

In the elastic wave device 41 as well, similarly as in the first preferred embodiment, the multilayer film 3 is partially removed in the region outside the region where the piezoelectric thin film 6 is provided, and the first insulating layers 10 and 11 are provided in at least a portion of the region where the multilayer film 3 is removed. Thus, fracturing or cracking of the piezoelectric thin film due to a force applied during cutting with a dicing machine or when the external connection terminal is joined is less likely to occur. In addition, interfacial peeling at the multilayer film 3 is also less likely to occur. Therefore, deterioration of electric characteristics is also less likely to occur.

In addition, in the present preferred embodiment, the first insulating layers 10 and 11 are made of a resin and have elasticity. Therefore, it is possible to more effectively absorb stress applied when the external connection terminal is joined or when mounting on a mount board is performed by using the external connection terminal. Moreover, as described above, due to the presence of the first insulating layers 10 and 11, breaking of the wiring electrodes 8 and 9 is also less likely to occur.

Figure 13:
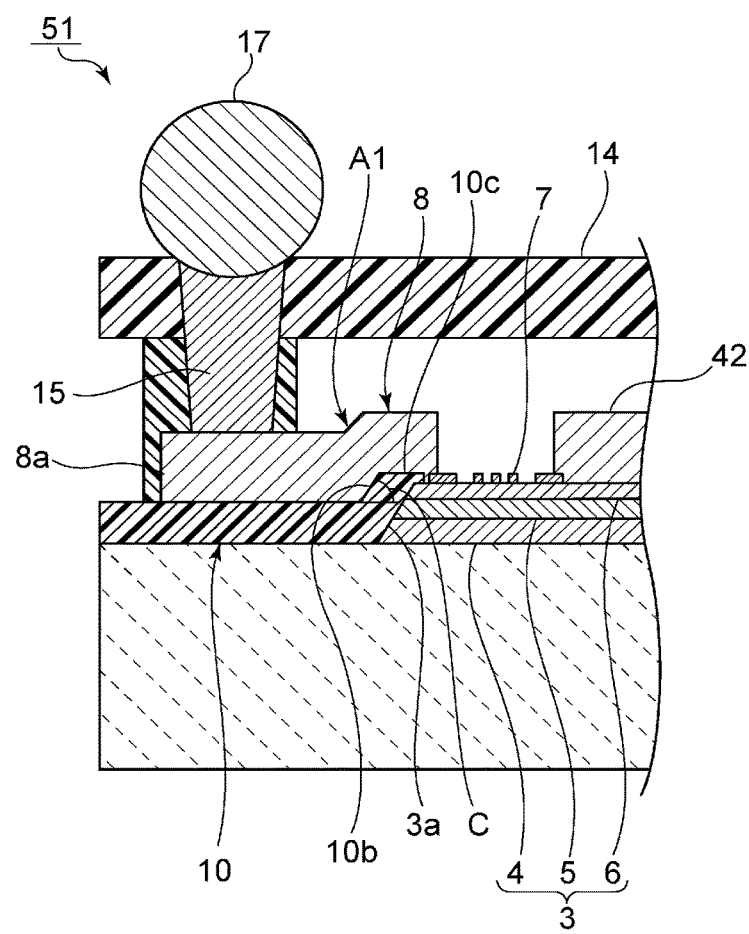
FIG. 13 is a partially cutaway cross-sectional view illustrating an elastic wave device according to a fifth preferred embodiment of the present invention.

FIG. 13 is a partially cutaway elevational cross-sectional view of an elastic wave device according to a fifth preferred embodiment of the present invention. The elastic wave device 51 according to the fifth preferred embodiment corresponds to a modification of the elastic wave device 41 according to the fourth preferred embodiment. As shown in FIG. 13, in the elastic wave device 51, the first insulating layer 10 extends over the side surface 3a of the multilayer film 3 onto the upper surface of the multilayer film 3. In FIG. 11, the first insulating layer 10 is a flat film-shaped layer. However, in the elastic wave device 51, the first insulating layer 10 extends from the portion where the first insulating layer 10 is located on the support substrate 2, to the upper end of the side surface 3a of the multilayer film 3, and further extends onto the upper surface of the multilayer film 3. Therefore, the wiring electrode 8 extends on an inclined surface 10b at the outer side of the first insulating layer 10 and onto the upper surface 10c of the first insulating layer 10. The inclined surface 10b is inclined so as to located closer to the interdigital transducer electrode 7 side as the inclined surface extends upward. Thus, a change of a portion, indicated by an arrow A1, of the wiring electrode 8 is gentle. Thus, it is possible to more effectively prevent breaking of the wiring electrode 8 in the portion indicated by the arrow A1.

Preferably, an inclination angle C that is an angle of the inclined surface 10b relative to the upper surface of the support substrate 2 is preferably equal to or less than about 85°, more preferably equal to or less than about 80°, and further preferably equal to or less than about 60°, for example. Thus, it is possible to more effectively prevent the above-described breaking.

Figure 14:
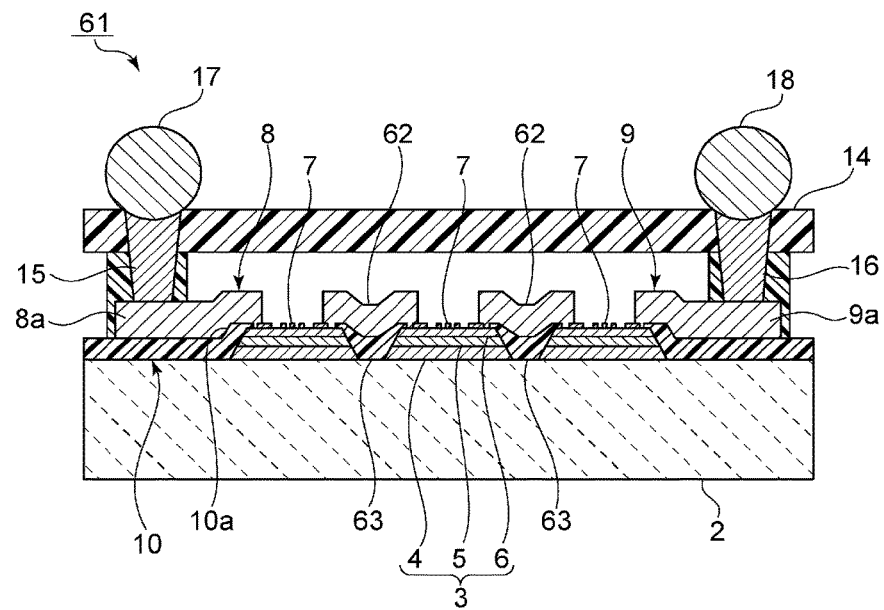
FIG. 14 is a schematic elevational cross-sectional view of an elastic wave device according to a sixth preferred embodiment of the present invention.

FIG. 14 is a schematic elevational cross-sectional view of an elastic wave device according to a sixth preferred embodiment of the present invention. The elastic wave device 61 is configured in substantially the same manner as the elastic wave device according to the fifth preferred embodiment, and is different therefrom in that the multilayer film 3 is removed below each connection wire 62 connecting the interdigital transducer electrodes 7 to each other, and a second insulating layer 63 is provided between the upper surface of the support substrate 2 and each connection wire 62.

The second insulating layer 63 may be formed by using an appropriate insulating material. The same material as the material used for the first insulating layers 10 and 11 may be used as such an insulating material. Preferably, the second insulating layers 63 are made of the same insulating material as that of the first insulating layers 10 and 11. In this case, after the multilayer film 3 is partially removed, it is possible to form the first insulating layers 10 and 11 and the second insulating layers 63 by the same step.

In the region where the insulating layers 63 are provided, it is not necessarily required to remove the entire multilayer film 3. That is, only the piezoelectric thin film 6 may be removed, and a second insulating layer may be formed in the portion where the piezoelectric thin film is removed. Preferably, at least the piezoelectric thin film 6 is removed, and the second insulating layer 63 is formed. Thus, it is possible to prevent fracturing of the piezoelectric thin film 6, spread of the fracture, or the like.

In addition, the multilayer film 3 may be removed by etching or the like from above so as to reach the intermediate height position of the high-acoustic-velocity film 4 or the intermediate height position of the low-acoustic-velocity film 5 of the multilayer film 3. In this case, the second insulating layer 63 is provided in the portion removed by the etching.

The other components of the sixth preferred embodiment are the same as those of the first preferred embodiment, and thus are designated by the same reference numerals, and the detailed description thereof is omitted.

In the elastic wave device 61 according to the sixth preferred embodiment as well, the other components are the same as those of the fourth and fifth preferred embodiments, and thus the same advantageous effects as those of the elastic wave devices 41 and 51 according to the fourth and fifth preferred embodiments are exerted.

Figure 15:
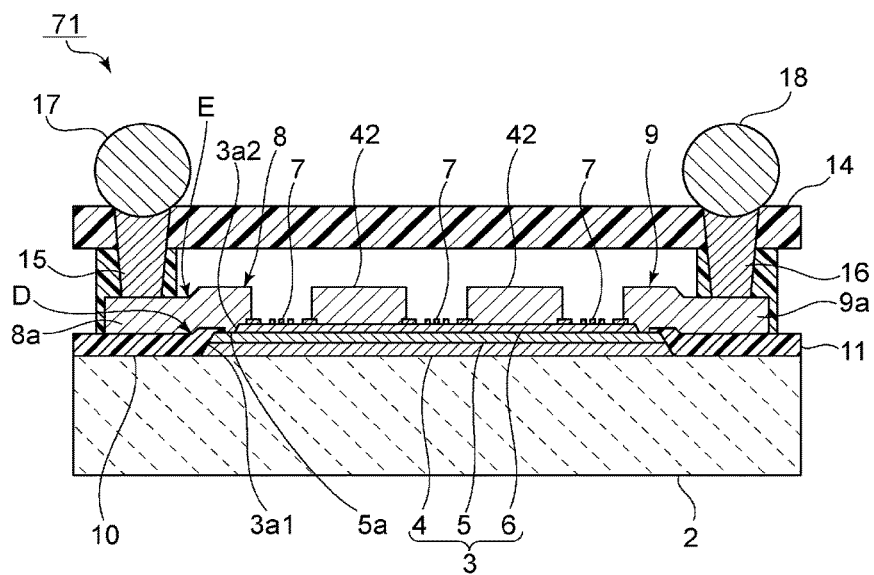
FIG. 15 is a schematic elevational cross-sectional view of an elastic wave device according to a seventh preferred embodiment of the present invention.

FIG. 15 is a schematic elevational cross-sectional view of an elastic wave device according to a seventh preferred embodiment of the present invention. In the elastic wave device 71, 1) the multilayer film 3 includes a first side surface portion 3a1 located on the side surfaces of the high-acoustic-velocity film 4 and the low-acoustic-velocity film 5, and a second side surface portion 3a2 located on the side surface of the piezoelectric thin film 6, and the first side surface portion 3a1 and the second side surface portion 3a2 are separated from each other via a step, and 2) the first insulating layer 10 extends onto an upper surface portion 5a of the low-acoustic-velocity film 5 that is the step.

The other components of the elastic wave device 71 are the same as those of the elastic wave device 41. Therefore, the same portions are designated by the same reference numerals, and the detailed description thereof is omitted.

In the elastic wave device 71, the side surface of the multilayer film 3 preferably has a stepped shape so as to have the first side surface portion 3a1 and the second side surface portion 3a2. The first insulating layer 10 extends to a flat surface portion defining the step and extending substantially in a horizontal direction. In this manner, the first insulating layer 10 may not cover the entire side surface of the multilayer film 3, and may reach the intermediate height position of the side surface.

Furthermore, the first insulating layer 10 covers the first side surface portion 3a1 from below toward above. Therefore, a change of a portion, indicated by an arrow D, of the upper surface of the first insulating layer is made gentle. Thus, a change of a portion, indicated by an arrow E, of the wiring electrode 8 is made gentle. Thus, it is possible to effectively prevent breaking of the wiring electrode 8.

The flat surface portion may not necessarily extend in the horizontal direction, and the inclination thereof suffices to be gentler than that of portions other than the side surface.

In the present preferred embodiment as well, stress or the like applied when an external terminal is joined is less likely to be applied to the piezoelectric thin film 6. Thus, similarly as in the first to sixth preferred embodiments described above, it is possible to prevent fracture or peeling of the piezoelectric thin film 6.

Figure 16:
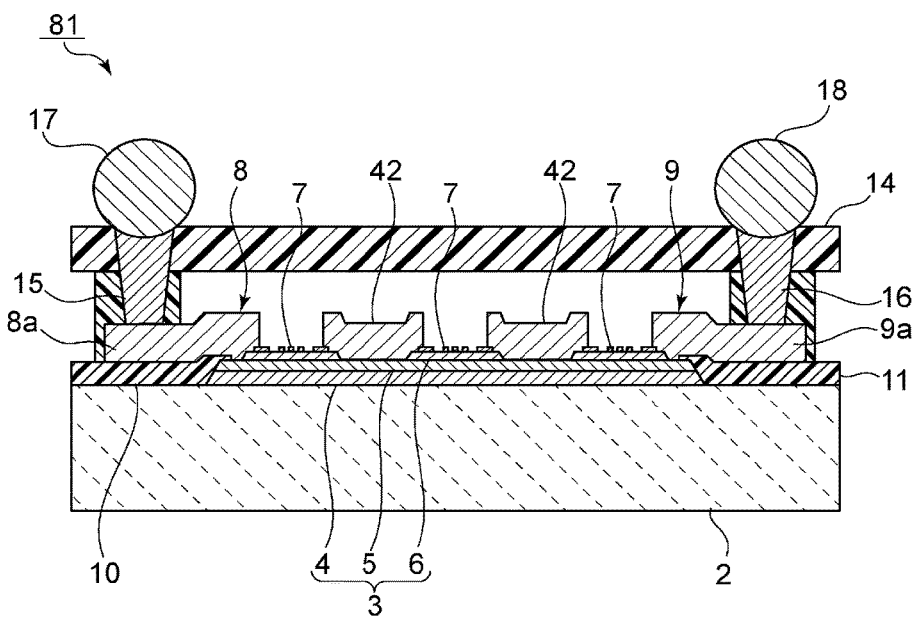
FIG. 16 is a schematic elevational cross-sectional view of an elastic wave device according to an eighth preferred embodiment of the present invention.

FIG. 16 is a schematic elevational cross-sectional view of an elastic wave device according to an eighth preferred embodiment of the present invention. The elastic wave device 81 is configured in the same manner as the elastic wave device 71, except that the piezoelectric thin film 6 is not present below each connection wire 42. That is, in various preferred embodiments of the present invention, only the piezoelectric thin film 6 of the multilayer film 3 may be removed below each connection wire 42. In addition, in this structure, not only the piezoelectric thin film 6 but also at least a partial layer of the low-acoustic-velocity film 5 may be removed. Moreover, in addition to the piezoelectric thin film 6 and the low-acoustic-velocity film 5, at least a partial layer of the high-acoustic-velocity film 4 may be removed.

Furthermore, in the case where the support substrate 2 does not have conductivity, all the layers of the multilayer film 3 may be removed below each connection wire 42. In addition, a recess may be formed on the upper surface of the support substrate 2 by over etching or the like, and a connection wire 42 may be formed so as to reach the recess.

The other components of the elastic wave device 81 according to the eighth preferred embodiment are the same as those of the elastic wave device 71, and thus the same advantageous effects are exerted.

Figure 17:
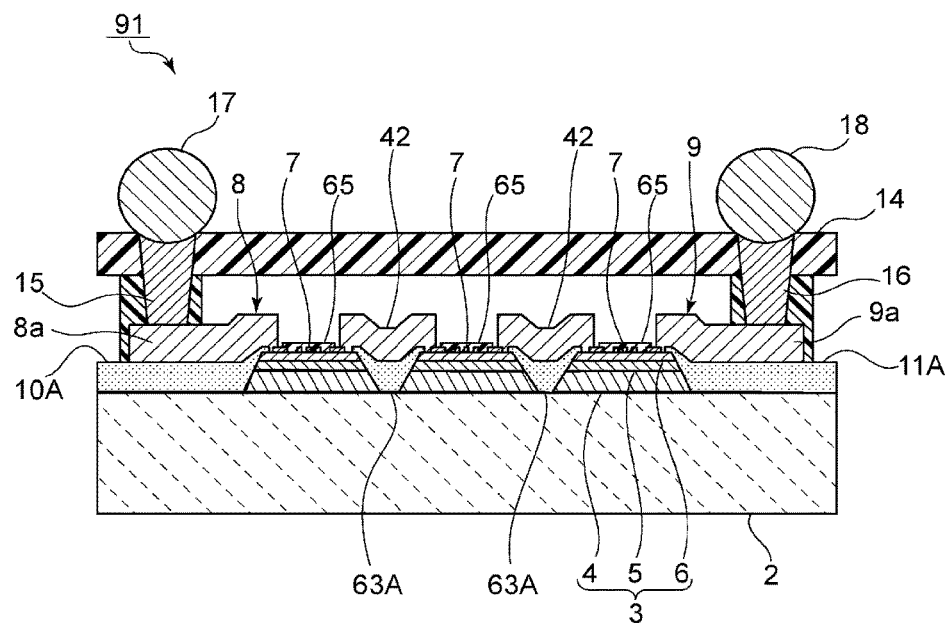
FIG. 17 is a schematic elevational cross-sectional view of an elastic wave device according to a ninth preferred embodiment of the present invention.

FIG. 17 is a schematic elevational cross-sectional view of an elastic wave device according to a ninth preferred embodiment of the present invention. In the elastic wave device 91, first insulating layers 10A and 11A are made of an inorganic insulating material. Similarly, second insulating layers 63A made of an inorganic insulating material are provided also below the connection wires 42. That is, the multilayer film 3 is removed below the connection wires 42, and the second insulating layers 63A are formed therein.

An appropriate inorganic insulating material may be used as the inorganic insulating material of the first insulating layers 10A and 11A and the second insulating layers 63A. Examples of such an inorganic insulating material include silicon oxide, silicon nitride, alumina, and silicon oxynitride. As in the present preferred embodiment, the first and second insulating layers are not limited to the resin material such as a synthetic resin, and may be made of an inorganic insulating material.

In this case as well, the first insulating layers 10A and 11A are preferably made of the same material as that of the second insulating layers 63A. In this case, in the same process, it is possible to form the first insulating layers 10A and 11A and the second insulating layers 63A. A protective film 65 covers each interdigital transducer electrode 7. The protective film 65 is made of the same material as that of the first insulating layer and the second insulating layer. The protective film 65 is not essential.

The other components of the ninth preferred embodiment are the same as those of the elastic wave devices 71 and 81, and thus the same advantageous effects are exerted.

Figure 18:
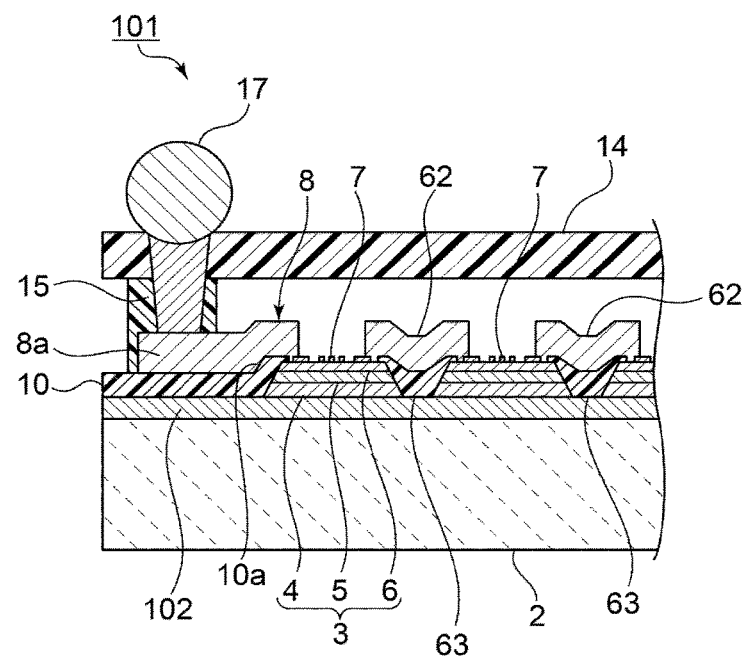
FIG. 18 is a partially cutaway cross-sectional view for explaining an elastic wave device according to a tenth preferred embodiment of the present invention.

FIG. 18 is a partially cutaway cross-sectional view for explaining an elastic wave device according to a tenth preferred embodiment of the present invention. The elastic wave device 101 corresponds to a modification of the elastic wave device 61 shown in FIG. 14. That is, a third insulating layer 102 provided on the support substrate 2 is further added to the elastic wave device 61 in FIG. 14. The third insulating layer 102 is provided on the entire upper surface of the support substrate 2. The same structure as that of the elastic wave device 61 is provided on the third insulating layer 102. Therefore, the same portions are designated by the same reference numerals, and the detailed description thereof is omitted.

The third insulating layer 102 is made of an appropriate insulating material. A resin or an inorganic insulating material may be used as such an insulating material. In the present preferred embodiment, the third insulating layer 102 is made of an inorganic insulating material such as silicon oxide. A first insulating layer 10 may be provided on the third insulating layer 102.

Since the third insulating layer 102 is provided, for example, it is possible to omit the second insulating layer 63, which is provided below each connection wire 62. That is, even in the case where the support substrate 2 has conductivity, since the third insulating layer 102 is provided, it is possible to prevent short-circuiting between each connection wire 62 and the support substrate 2.

The other components of the elastic wave device 101 are the same as those of the elastic wave device 61, and thus the same advantageous effects as those of the elastic wave device 61 are exerted.

Figure 19:
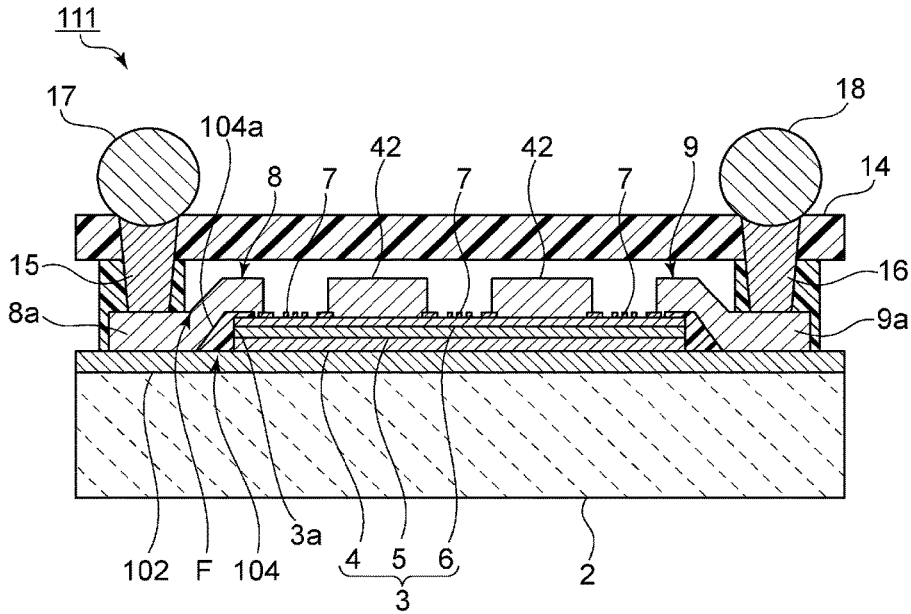
FIG. 19 is a schematic elevational cross-sectional view illustrating an elastic wave device according to an eleventh preferred embodiment of the present invention.

FIG. 19 is a schematic elevational cross-sectional view of an elastic wave device according to an eleventh preferred embodiment of the present invention. In the elastic wave device 111, an electrode pad 8a of a wiring electrode 8 is additionally provided on the third insulating layer 102. Therefore, stress or the like applied when an external terminal is joined is alleviated by the third insulating layer 102. Thus, in this case, the third insulating layer 102 is desirably made of a flexible resin.

On the other hand, the side surface 3a of the multilayer film 3 extends in a direction perpendicular or substantially perpendicular to the upper surface of the support substrate 2. Therefore, a first insulating layer 104 is provided to alleviate change of a portion, indicated by an arrow F, of the wiring electrode 8. The first insulating layer 104 is in contact with the side surface 3a, and an outer surface 104a opposite to the side surface 3a is an inclined surface. The inclined surface is inclined from the direction perpendicular or substantially perpendicular to the upper surface of the support substrate 2, and gets closer to the interdigital transducer electrode as the inclined surface extends upward. Therefore, the change of the portion, indicated by the arrow F, of the wiring electrode 8 is alleviated. Thus, it is made possible to effectively prevent breaking of the wiring electrode 8. The other components of the elastic wave device 111 are the same as those of the elastic wave device 71, and thus the same advantageous effects are exerted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support substrate;
   a multilayer film provided on the support substrate and including a piezoelectric thin film;
   an interdigital transducer electrode provided on a surface of the piezoelectric thin film;
   an electrode pad electrically connected to the interdigital transducer electrode; and
   a first insulating layer provided on the support substrate in a region outside the multilayer film in a plan view in a direction of thickness of the support substrate, and located below the electrode pad.

2. The elastic wave device according to claim 1, wherein the first insulating layer is made of a resin.

3. The elastic wave device according to claim 1, wherein the support substrate is made of a conductor or a semiconductor, and the first insulating layer is located below an external connection terminal that is connected to the electrode pad.

4. The elastic wave device according to claim 3, wherein the first insulating layer is made of a resin.

5. The elastic wave device according to claim 1, further comprising:
   a wiring electrode connected to the interdigital transducer electrode; wherein
   the electrode pad is connected to the interdigital transducer electrode via the wiring electrode; and
   an external connection terminal is connected to the electrode pad.

6. The elastic wave device according to claim 1, wherein the first insulating layer includes an insulating layer extension portion extending from the region outside the multilayer film, to a region where the multilayer film is provided.

7. The elastic wave device according to claim 6, wherein the insulating layer extension portion covers a portion of the piezoelectric thin film.

8. The elastic wave device according to claim 5, wherein the wiring electrode extends from the upper surface of the multilayer film via a side surface of the multilayer film to the electrode pad.

9. The elastic wave device according to claim 8, wherein the side surface on which the wiring electrode of the multilayer film is provided is an inclined surface inclined from a direction perpendicular or substantially perpendicular to an upper surface of the support substrate, and the inclined surface is closer to the interdigital transducer electrode side as the inclined surface extends from below toward above.

10. The elastic wave device according to claim 9, wherein the inclined surface of the multilayer film includes a step.

11. The elastic wave device according to claim 9, wherein the first insulating layer covers at least a portion of the inclined surface.

12. The elastic wave device according to claim 1, wherein
   a plurality of interdigital transducer electrodes are provided as the interdigital transducer electrode provided on the surface of the piezoelectric thin film; and
   the elastic wave device further comprises a connection wire connecting the adjacent interdigital transducer electrodes to each other.

13. The elastic wave device according to claim 12, wherein portions of the layers of the multilayer film is provided between the connection wire and the support substrate.

14. The elastic wave device according to claim 13, wherein a second insulating layer is provided between the support substrate and the connection wire and is made of a same material as that of the first insulating layer.

15. The elastic wave device according to claim 1, wherein a third insulating layer is further provided between the multilayer film and the support substrate.

16. The elastic wave device according to claim 15, wherein the first insulating layer is provided on the third insulating layer and provided between a side surface of the multilayer film and the electrode pad.

17. The elastic wave device according to claim 1, wherein the first insulating layer extends from a height position located below the electrode pad via a side surface of the multilayer film to an upper surface of the multilayer film, and an outer surface of the first insulating layer on a side surface of the multilayer film is an inclined surface that is inclined from a direction perpendicular or substantially perpendicular to an upper surface of the support substrate and is closer to the interdigital transducer electrode side as the inclined surface extends from below toward above.

18. The elastic wave device according to claim 1, wherein
   the multilayer film includes, as other layers, a high-acoustic-velocity film through which a bulk wave propagates at an acoustic velocity higher than that of an elastic wave that propagates through the piezoelectric thin film, and a low-acoustic-velocity film on the high-acoustic-velocity film and through which a bulk wave propagates at an acoustic velocity lower than that of a bulk wave that propagates through the piezoelectric thin film; and
   the piezoelectric thin film is provided on the low-acoustic-velocity film.

19. The elastic wave device according to claim 1, further comprising a low-acoustic-velocity film provided on a lower surface of the piezoelectric thin film and through which a transversal wave propagates at a relatively low acoustic velocity; wherein
   the support substrate is a high-acoustic-velocity support substrate laminated on a lower surface of the low-acoustic-velocity film and through which a transversal wave propagates at a relatively high acoustic velocity compared to the relatively low acoustic velocity.

20. The elastic wave device according to claim 1, further comprising an external connection terminal connected to the electrode pad and including a metal bump.

21. The elastic wave device according to claim 1, further comprising:
- a frame-shaped support member surrounds a region where the interdigital transducer electrode is provided; and
- a lid member fixed on the support member so as to close an opening in the frame-shaped support member.

22. The elastic wave device according to claim 21, further comprising an external connection terminal connected to the electrode pad and including an under bump metal layer and a metal bump joined to the under bump metal layer.

23. The elastic wave device according to claim 1, further comprising:
- a wiring electrode connected to the interdigital transducer electrode and the electrode pad; and
- an external connection terminal electrically connected to the electrode pad and located above the electrode pad.

* * * * *